United States Patent
Lai et al.

(10) Patent No.: US 9,916,990 B2
(45) Date of Patent: Mar. 13, 2018

(54) PACKAGING SUBSTRATE HAVING A HOLDER, METHOD OF FABRICATING THE PACKAGING SUBSTRATE, PACKAGE STRUCTURE HAVING A HOLDER, AND METHOD OF FABRICATING THE PACKAGE STRUCTURE

(71) Applicant: Unimicron Technology Corp., Taoyuan (TW)

(72) Inventors: Wen-Lung Lai, Taoyuan (TW); Yuan-Liang Lo, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 122 days.

(21) Appl. No.: 14/955,053

(22) Filed: Dec. 1, 2015

(65) Prior Publication Data
US 2016/0086822 A1  Mar. 24, 2016

Related U.S. Application Data

(62) Division of application No. 13/406,673, filed on Feb. 28, 2012, now Pat. No. 9,230,899.

(30) Foreign Application Priority Data

Sep. 30, 2011 (TW) .............................. 100135652 A

(51) Int. Cl.
*H01L 21/48* (2006.01)
*H01L 23/498* (2006.01)
(Continued)

(52) U.S. Cl.
CPC ........ *H01L 21/486* (2013.01); *H01L 21/4846* (2013.01); *H01L 21/4857* (2013.01); *H01L 21/56* (2013.01); *H01L 23/49816* (2013.01); *H01L 23/49827* (2013.01); *H01L 23/49838* (2013.01); *H01L 23/49866* (2013.01);
(Continued)

(58) Field of Classification Search
CPC .... H05K 3/0097; H05K 3/007; H05K 3/0052; H05K 3/205; H01L 21/486; H01L 21/4846; H01L 21/4857; H01L 21/56; H01L 23/49816; H01L 2224/32225;
(Continued)

(56) References Cited

U.S. PATENT DOCUMENTS 5,505,321 A * 4/1996 Caron ................. H05K 3/0097
174/250
6,210,518 B1 * 4/2001 Lee ....................... H05K 3/007
156/247

(Continued)

*Primary Examiner* — Peter DungBa Vo
*Assistant Examiner* — Jeffrey T Carley
(74) *Attorney, Agent, or Firm* — JCIPRNET

(57) ABSTRACT

A packaging substrate includes a holder, a first conductive pad disposed on the holder, a core layer disposed on the holder, a circuit layer disposed on the core layer, a plurality of conductive vias disposed in the core layer, and an insulating protection layer disposed on the core layer, wherein the first electrical pad is embedded in the core layer. By combining the holder on one side of the packaging substrate, cracks due to over-thinness can be prevented during transferring or packaging. A method of fabricating the packaging substrate, a package structure having a holder, a method of fabricating the package structure are also provided.

3 Claims, 4 Drawing Sheets

(51) Int. Cl.
   *H01L 21/56* (2006.01)
   *H01L 23/31* (2006.01)
   *H05K 3/00* (2006.01)
   *H05K 3/20* (2006.01)
   *H01L 23/00* (2006.01)

(52) U.S. Cl.
   CPC ........ *H01L 23/49894* (2013.01); *H01L 24/85* (2013.01); *H01L 24/97* (2013.01); *H05K 3/007* (2013.01); *H05K 3/0097* (2013.01); *H01L 23/3128* (2013.01); *H01L 24/48* (2013.01); *H01L 24/73* (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01); *H01L 2224/85444* (2013.01); *H01L 2224/97* (2013.01); *H01L 2924/00014* (2013.01); *H01L 2924/12042* (2013.01); *H01L 2924/15311* (2013.01); *H01L 2924/15747* (2013.01); *H01L 2924/181* (2013.01); *H05K 3/0052* (2013.01); *H05K 3/205* (2013.01); *Y10T 29/49165* (2015.01)

(58) Field of Classification Search
   CPC . H01L 2224/48091; H01L 2924/00014; H01L 2924/12042; Y10T 29/49165
   See application file for complete search history.

(56) References Cited

U.S. PATENT DOCUMENTS

| | | | |
|---|---|---|---|
| 6,246,009 B1 * | 6/2001 | Millette | H05K 3/0097 174/250 |
| 6,580,036 B2 * | 6/2003 | Kim | H05K 3/4623 174/255 |
| 2001/0027875 A1 * | 10/2001 | Kim | H05K 3/4623 174/255 |
| 2003/0015348 A1 * | 1/2003 | Lee | H01L 23/3128 174/260 |
| 2004/0074088 A1 * | 4/2004 | Nakamura | H01L 21/4857 29/831 |

* cited by examiner

PACKAGING SUBSTRATE HAVING A HOLDER, METHOD OF FABRICATING THE PACKAGING SUBSTRATE, PACKAGE STRUCTURE HAVING A HOLDER, AND METHOD OF FABRICATING THE PACKAGE STRUCTURE

CROSS-REFERENCE TO RELATED APPLICATION

This is a divisional application of and claims the priority benefit of U.S. prior application Ser. No. 13/406,673, filed on Feb. 28, 2012, now allowed. The prior application Ser. No. 13/406,673 claims the priority benefit of Taiwan application serial no. 100135652, filed on Sep. 30, 2011. The entirety of each of the above-mentioned patent applications is hereby incorporated by reference herein and made a part of this specification.

BACKGROUND OF THE INVENTION

1. Field of the Invention

The present invention relates to semiconductor packaging substrates, and, more particularly, to a packaging substrate for carrying semiconductor chip, a method of fabricating the packaging substrate, a package structure having the packaging substrate, and a method of fabricating the package structure.

2. Description of Related Art

With the rapid development of electronics industry, electronic products gradually trend towards multi-function and high-performance. In order to meet the requirements of the miniaturization of semiconductor package units, it is developed towards the reduction of the thickness of a packaging substrate carrying chips. The packaging substrate currently for carrying the chips can be classified into hard material substrates and soft material substrates. The packaging substrate for a ball grid array (BGA) package is usually subjected to a hard material substrate.

Referring to FIGS. 1A-1D, cross-sectional diagrams illustrating a method of fabricating a packaging substrate 1a having two layers of circuits in accordance with the prior art are provided.

As illustrated in FIG. 1A, a core layer 13 having a first surface 13a and a second surface 13b opposite to the first surface 13a is provided. Copper layers 11a and 11b are disposed on the first surface 13a and the second surface 13b, respectively.

As illustrated in FIG. 1B, a plurality of through holes 130 are formed in the core layer 13 from the second surface 13b of the core layer 13 via a laser drilling technique such that the copper layer 11a on the first surface 13a is exposed from the through holes 130.

As illustrated in FIG. 1C, the copper layers 11a and 11b are patterned. First and second circuit layers 12 and 14 are respectively formed on the first and second surfaces 13a and 13b by electroplating through a conductive seed-layer 10. Conductive vias 140 are formed in the through holes 130 and electrically connect the first and second circuit layers 12 and 14. The first and second circuit layers 12 and 14 have a plurality of first and second conductive pads 120 and 141, respectively.

As illustrated in FIG. 1D, insulating protection layers 15 are formed on the first and second surfaces 13a and 13b, respectively, and the conductive vias 140 are filled with a portion of the insulating protection layer 15. A plurality of openings 150 are foamed in the insulating protection layers 15, and the first and second conductive pads 120 and 141 are exposed from the openings 150, and the packaging substrate 1a is thus formed. Surface treatment layers 15a are formed on the exposed surfaces of the first and second conductive pads 120 and 141.

As illustrated in FIG. 1E, a chip 170 is disposed on one of the insulating protection layers 15 and electrically connected to the second conductive pads 141 via conducting wires 17. An encapsulant 18 is formed to cover the chip 170. Solder balls 19 are disposed on the first conductive pads 120, and a package structure 1 is thus obtained. In order to satisfy the requirements of miniaturization and reliability, the thickness of the core layer 13 can be reduced to 60 μm.

However, with the increasing demand for miniaturization, the core layer 13 having a thickness of 60 μm cannot satisfy the increasing requirement for miniaturization of package units. If the thickness of the core layer 13 is less than 60 μm, the total thickness R of the packaging substrate 1a will be less than 130 μm and thus leads to poor production operability. For example, the packaging substrate 1a easily sticks during moving between process work stations, and thus is adverse for production. Even if production is performed, during transportation or packaging, it is easily bended or broke due to reduced thickness, and thus leads to useless or defected products.

Further, in order to facilitate production of fine pitch circuits, the thickness of the copper layers 11a and 11b is close to 3 μm, so that the copper layer 11a is easily penetrated by laser. In order to prevent the laser from penetrating the copper layer 11a, laser energy is typically adjusted less so as to increase the number of laser shots. As a result, this leads to prolonged process time and increased costs.

Also, in a fabricating method of the packaging substrate 1a in accordance with the prior art, since the depth of the through hole 130 is too deep, electroplating performance is poor to prevent voids from occurrence during the formation of the conductive vias 140, and it also easily has voids while the insulating protection layer 15 is applied to fill the conductive vias 140.

Therefore, how to overcome the problems of the prior art as described above, is becoming the topic in urgent need to be solved.

SUMMARY OF THE INVENTION

In view of above-mentioned problems of the prior art, the present invention provides a packaging substrate having a holder. The holder is disposed on one side of the packaging substrate and includes a copper clad laminate and a strengthened board, wherein the strengthened board has a dielectric layer in combination with a copper layer of the copper clad laminate, a first metal stripping layer formed on the dielectric layer, and a second metal stripping layer formed on the first metal stripping layer.

The present invention further provides a method of fabricating a packaging substrate having a holder, comprising: providing two stacked copper clad laminates, each of which having an insulating layer and copper layers disposed on opposite sides of the insulating layer; forming a strengthened board to embed the two copper clad laminates therein, the strengthened board having a dielectric layer covering the two copper clad laminates, two first metal stripping layers formed on opposite surface of the dielectric layer, and two second metal stripping layers respectively formed on each one of the first metal stripping layers; forming a plurality of first conductive pads on the second metal stripping layers;

forming on each one of the second metal stripping layer and the first conductive pads a core layer having a first surface and a second surface opposite to the first surface, allowing the first conductive pads to be embedded in the first surface of the core layer; forming a circuit layer on the second surface of each one of the core layers; forming in the core layers a plurality of conductive vias for electrically connecting the first conductive pads and the circuit layers, the circuit layers having a plurality of second conductive pads; forming an insulating protection layer on the second surface of each one of the core layers and the circuit layers; forming in the insulating protection layers a plurality of openings from which the second conductive pads are exposed; and cutting through the two stacked copper clad laminates along predetermined lines approximate to sides of the two copper clad laminates such that the stacked copper layers of the two copper clad laminates are allowed to be separated from each other so as to be separated into two individual packaging substrates each having a holder.

In an embodiment, the first metal stripping layer is connected to the second metal stripping layer in a physical manner.

In an embodiment, a surface treatment layer is further formed on the exposed second conductive pads.

The present invention further provides a package structure having a holder and a method of fabricating the package structure. A chip is further disposed on the insulating protection layer of the packaging substrate, and an encapsulant is formed to encapsulate the chip.

In an embodiment, the package structure is cut into a plurality of package units, and the surfaces of the first conductive pads are lower than the first surface of the core layer.

In an embodiment, the chip is electrically connected to the second conductive pads.

Known from above, the packaging substrate having the holder, the method of fabricating the packaging substrate, the package structure, and the method of fabricating the package structure of the present invention not only allow the thickness of the core layer to be less than 130 μm but also enhance the strength of the packaging substrate such that cracks due to reduced thickness can be prevented during transferring or packaging.

Further, the copper clad laminate and the strengthened board are removed after packaging process is completed. At this time, the thickness of the packaging substrate is less than 130 μm. Therefore, compared with the prior art, the present invention reduces the overall thickness of the package structure so as to simultaneously satisfy the requirements of product miniaturization and reliability.

In addition, compared with the prior art, the present invention can perform electroplating by directly using the second metal stripping layer as the conductive path without additionally forming electroplating conducting traces on the core layer such that the overall process can be simplified.

Also, even if the thickness of the copper foils on two sides of the core layer is too thin, but because the copper clad laminate and the strengthened board are combined with the packaging substrate, laser energy can be dispersed and thus the first conductive pads will not be punctured due to the first metal stripping layer and the second metal stripping layer beneath the first conductive pads during the laser drilling process. Therefore, compared to the prior art, the present invention can apply greater laser energy reduce shooting amount, thereby effectively decrease fabricating time and costs.

In addition, since the thickness of the core layer can be extreme thin, the depth of the conductive via can be extreme shallow. Therefore, there is no improper electroplating copper problem so as to prevent hole wrapping phenomenon.

DESCRIPTION OF THE EMBODIMENTS

The following illustrative embodiments are provided to illustrate the disclosure of the present invention, these and other advantages and effects can be apparently understood by those in the art after reading the disclosure of this specification.

Note that the structures, proportions, sizes depicted in the accompanying figures merely illustrate the disclosure of the specification to allow for comprehensive reading without a limitation to the implementation or applications of the present invention, and does not constitute any substantial technical meaning. Any variations or alterations to the structures, proportional relations or sizes should be encompassed within the scope of the disclosure.

Meanwhile, the terms that are quoted in the explanation like "upper," "a" and so on only intent for convenience of description rather than limiting feasible scope of the disclosed embodiments. Change or adjustment of relative relationship under no actual alteration of content of technique should be seen as feasible scope of the disclosed embodiments.

Referring to FIGS. 2A-2F, cross-sectional views illustrates a method of fabricating a packaging substrate 2 having a holder 2b in accordance with the present invention.

Figure 1A:
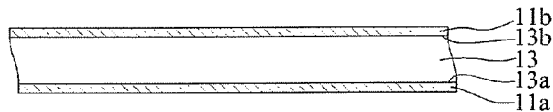
FIGS. 1A-1E are cross-sectional diagrams illustrating a method of fabricating a packaging substrate and a package structure in accordance with the prior art.
Figure 1B:
Figure 1C:
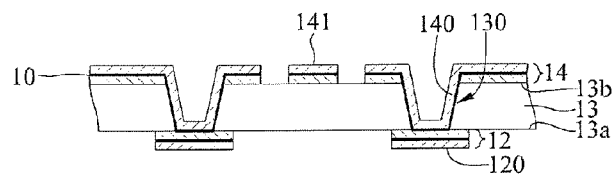
Figure 1D:
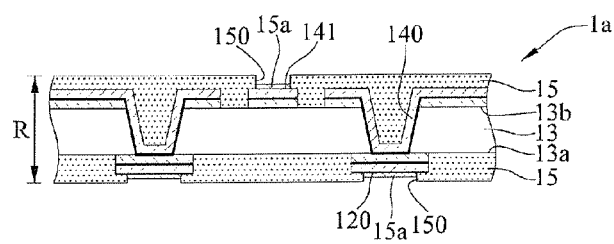
Figure 1E:
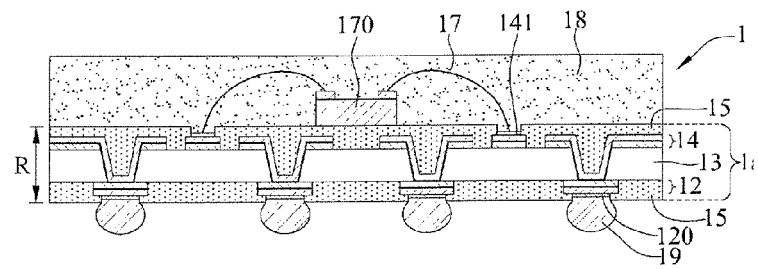
Figure 2A:
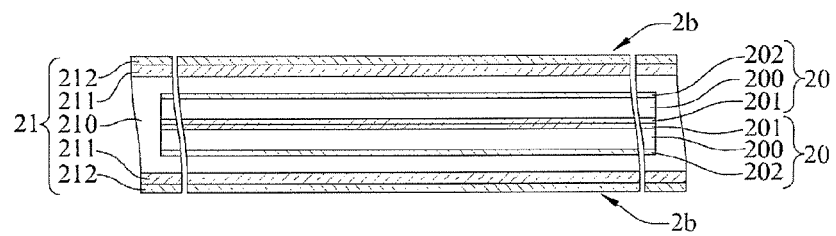
FIGS. 2A-2F are cross-sectional diagrams illustrating a method of fabricating a packaging substrate having a holder in accordance with the present invention.

As illustrated in FIG. 2A, two copper clad laminates (CCL) 20 and two strengthened members 21 are provided. Each of the copper clad laminates 20 has an insulating layer 200 and copper layers 201 and 202 formed on opposite sides of the insulating layer 200. The two copper clad laminates 20 are stacked with each other via the copper layers 201. Each of the strengthened members 21 has a dielectric layer 210, a first metal stripping layer 211 formed on the dielectric layer 210, and a second metal stripping layer 212 formed on the first metal stripping layer 211.

In the embodiment, the insulating layer 200 is made of Bismaleimide Triazine (BT) and has a thickness of 100 μm, and the copper layers has a thickness of 12 μm.

The dielectric layers 210 of the strengthened members 21 are pressed against the two stacked copper clad laminates 20 such that the two dielectric layers 210 are integrated into a single dielectric layer so as to cover the two copper clad laminates 20 and the two strengthened members 21 are accordingly formed into a strengthened board.

In the embodiment, the dielectric layer 210 has a thickness of 100 μm, and is made of prepreg (PP). The first metal stripping layer 211 is connected to the second metal stripping layer 212 by a physical method of sticking, static electricity, absorption, adhesion of the like. That is to say, the first metal stripping layer 211 and the second metal stripping layer 212 can be separated without the application of etched. Also, the first metal stripping layer 211 and the second metal stripping layer 212 can be made of a copper material and can have a thickness of 18 µm and 3 µm, respectively. The types of the copper clad laminate are numerous and well known in the art and thus detailed descriptions thereto are hereby omitted.

Figure 2B:
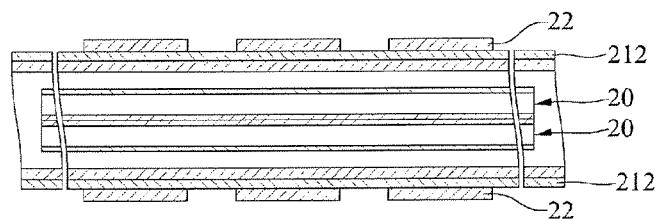

As illustrated in FIG. 2B, the second metal stripping layer 212 is employed as a conductive path, and a plurality of first conductive pads 22 are formed on the second metal stripping layer 212.

Figure 2C:
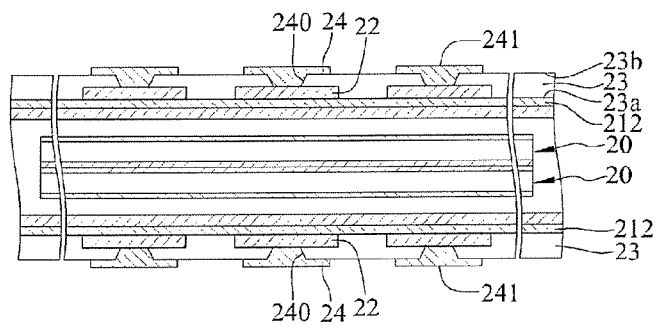

As illustrated in FIG. 2C, a core layer 23 is formed on the second metal stripping layer 212 and the first conductive pads 22, and has a first surface 23a and a second surface 23b opposite to the first surface 23a such that the first conductive pads 22 are embedded in the first surface 23a of the core layer 23.

A circuit layer 24 having a plurality of second conductive pads 241 is formed on the second surface 23b of the core layer 23, and a plurality of conductive vias 240 are formed in the core layer 23 for electrically connecting the first conductive pads 22 and the circuit layer 24.

In an embodiment, the core layer 23 is made of a dielectric material, and the types of relevant circuit formation process are numerous and unlimited, and thus are not described in detail.

Figure 2D:
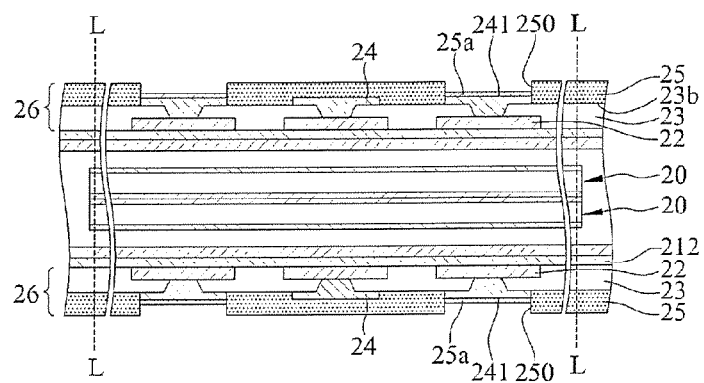

As illustrated in FIG. 2D, an insulating protection layer 25 is formed on the second surface 23b of the core layer 23 and the circuit layer 24 and has a plurality of openings 250 such that the second conductive pads 241 are exposed from the opening 250. It thus allows a circuit structure 26 to be formed by the first conductive pads 22, the core layer 23, the conductive vias 241, and the circuit layer 24.

The second metal stripping layer 212 is employed as the conductive path, and a surface treatment layer 25a is foil led on the second conductive pad 241 in each of the openings 250. In an embodiment, the surface treatment layer 25a is made of Ni/Au, Ni/Pd/Au, Au or the like and formed by an electrochemical electroplating process, electroplating process or the like. The surface treatment layer 25a is made of Ni/Au, Electroless Nickel/Electroless Palladium/Immersion Gold (ENEPIG) or Direct Immersion Gold (DIG) if an electrochemical electroplating method is applied. Alternatively, an electrochemical electroplating method and an electroplating method are combined via the second metal stripping layer 212 used to serve as the conductive path to form the surface treatment layer 25a made of such as electroplating nickel/electrochemical electroplating palladium/electroplating gold.

Figure 2E:
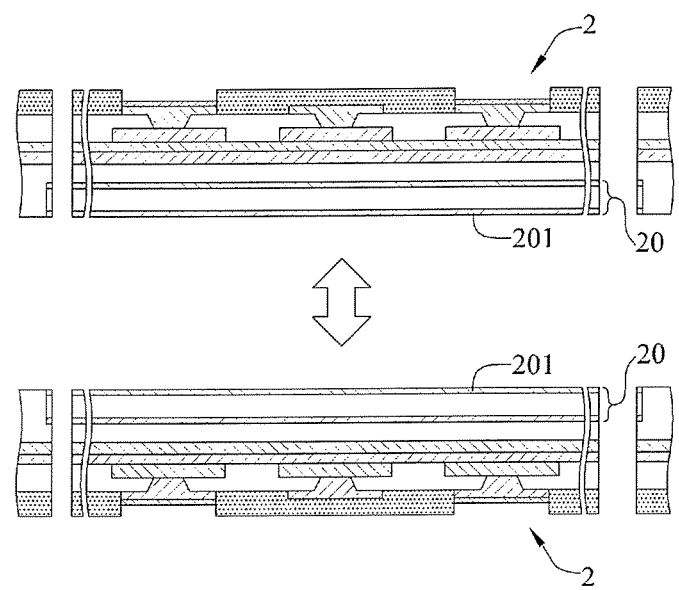
Figure 2F:
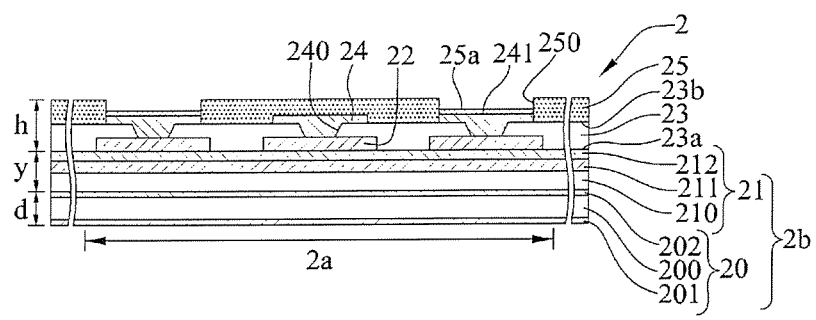

As illustrated in FIGS. 2E and 2F, the two copper clad laminates 20 are cut along a cutting line L approximate to the sides of the copper clad laminates 20 illustrated in FIG. 2D such that the copper layers 201 stacked with each other of the two copper clad laminates 20 are separated and an upper packaging substrate 2 and a lower packaging substrate 2 are accordingly obtained. Therefore, each of the packaging substrates 2 is composed of a holder 2b having the copper clad laminate 20 and the strengthened member 21 attached thereonto, and the circuit structure 26 formed on the strengthened member 21.

In an embodiment, a plurality of packaging substrates 2 can be formed at a time by the method described in the above. Each of the packaging substrates 2 has a plurality of package units 2a for hatch production in subsequent packaging process. The thickness of the packaging substrate 2 subtracting the thickness d of the copper clad laminate 20 and the thickness y of the strengthened member 21, i.e., the thickness h of the circuit structure 26, is less than 130 µm.

Two lots of packaging substrates 2 can be simultaneously manufactured by staking the two copper clad laminates 20, thereby increasing yield.

The present invention further provides the packaging substrate 2 having the holder 2b, comprising the copper clad laminate 20 having the copper layers 201 and 202 on opposite sides of the insulating layer 200, the strengthened member 21 disposed on one of the copper layers 202 of the copper clad laminate 20 so as to form the holder 2b by the copper clad laminate 20 and the strengthened member 21 disposed on the copper clad laminate 20, the first conductive pads 22 formed on the strengthened member 21, the core layer 23 formed on the strengthened member 21 and the first conductive pads 22, the circuit layer 24 thinned on the core layer 23, and the insulating protection layer 25 formed on the core layer 23 and the circuit layer 24.

The holder 2b comprises the copper clad laminate 20 and the strengthened member 21.

The type of the copper clad laminate 20 are numerous and are not particularly limited.

The strengthened member 21 has the dielectric layer 210 combined with the copper layer 202, the first metal stripping layer 211 formed on the dielectric layer 210 and the second metal stripping layer 212 formed on the first metal stripping layer 211. In an embodiment, the first metal stripping layer 211 is connected to the second metal stripping layer 212 in a physical manner.

The first conductive pads 22 are formed on the second metal stripping layer 212.

The core layer 23 has the first surface 23a and the second surface 23b opposite to the first surface 23a such that the second metal stripping layer 212 is connected to and the first conductive pads 22 are embedded in the first surface 23a of the core layer 23. In an embodiment, the core layer 23 is made of a dielectric material.

The circuit layer 24 is formed on the second surface 23b of the core layer 23 and has the plurality of second conductive pads 241 and the conductive vias 240 formed in the core layer 23 and electrically connected to the first conductive pads 22.

The insulating protection layer 25 is formed on the second surface 23b of the core layer 23 and the circuit layer 24 and has the plurality of openings 250 such that the second conductive pads 241 are exposed from the opening 250 so as for the surface treatment layer 25a to be formed on the second conductive pads 241 in the openings 250.

Known form the method of fabricating the packaging substrate 2 having the holder 2b, when a substrate having a thickness of less than 130 µm is fabricated, new manufacturing apparatuses have to be rearranged such that cost increases. The thickness h of the circuit structure 26 of the present invention is also less than 130 µm. However, when the packaging substrate 2 is fabricated, the overall thickness of the packaging substrate 2 can be greater than or equal to 130 µm via the thickness d of the copper clad laminate 20 and the thickness y of the strengthened board 21. Therefore, the apparatuses for use in the fabrication of the conventional packaging substrate can be used, such that the cost for fabricating the packaging substrate of the present invention is not increased.

Further, the packaging substrate 2 having the holder 2b composed of the copper clad laminate 20 and the strengthened member 21 can enhance the overall strength of packaging substrate 2 during packaging process. Therefore, compared to the prior art, the packaging substrate 2 of the present invention will not crack while being transported.

Also, the thickness of the core layer 23 of the present invention is extremely thin, for instance, less than 60 μm. However, the first conductive pads 22 will not be punctured during the laser drilling process for forming the conductive vias 240 due to the structural arrangement of the copper clad laminate 20 and the strengthened member 21. Therefore, greater laser energy can be applied to reduce the member of laser shootings, thereby effectively decreasing fabricating time and costs.

In addition, since the thickness of the core layer 23 is extremely thin, the depth of the conductive vias 240 can be extremely shallow. Therefore, there is no electroplating copper issue and the hole wrapping phenomenon can thus be prevented. And since the depth of the conductive via 240 is extremely shallow, the conductive vias 240 can be filled with electroplating copper without filling the insulating protection layer 250 into the conductive vias 240, such that hole void phenomenon can be effectively prevented.

Figure 3A:
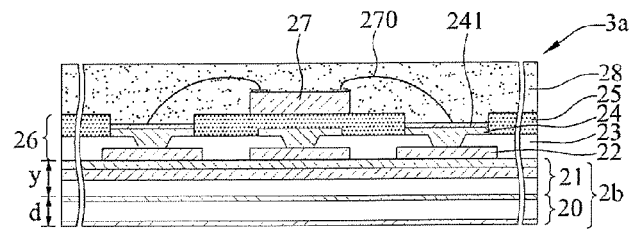
FIG. 3A is a cross-sectional diagram illustrating a method of fabricating a package structure having a holder in accordance with the present invention.

Referring to FIG. 3A, a cross-sectional diagram illustrating a method of fabricating a package structure 3a having the holder 2b in accordance with the present invention.

As illustrated in FIG. 3A, the packaging process is performed after the process of FIG. 2F. A chip 27 is disposed on the insulating protection layer 25 of the circuit layer 26, and the second conductive pads 241 are electrically connected to the chip 27 via conducting wires 270. An encapsulant 28 is formed on the insulating protection layer 25 so as to cover the chip 27 and the conducting wires 270 such that the package structure 3a having the holder 2b is formed.

Figure 3B:
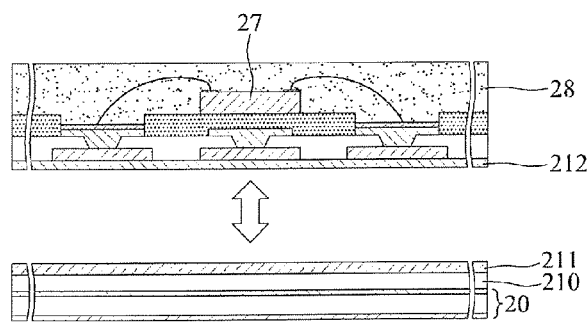
FIGS. 3B-3D are cross-sectional diagrams illustrating subsequent processes of a method of fabricating a packaging substrate having a holder in accordance with the present invention.
Figure 3C:
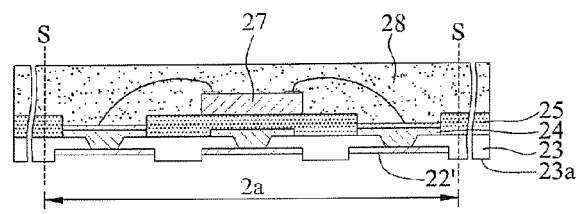
Figure 3D:
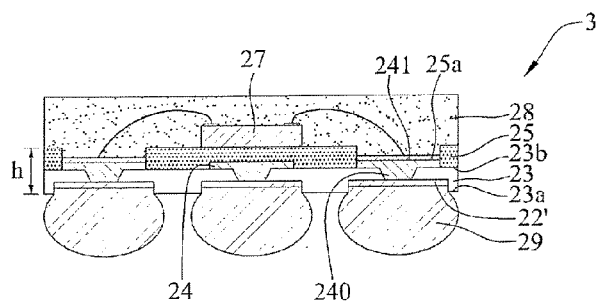

Referring to FIGS. 3B-3D, cross-sectional diagrams illustrating subsequent processes of a method of fabricating the package 3a having the holder 2b according to the present invention.

As illustrated in FIG. 3B, the first metal stripping layer 211 and the second metal stripping layer 212 are separated from each other so as to remove the copper clad laminate 20, the dielectric layer 210 and the first metal stripping layer 211, allowing the second metal stripping layer 212 to be exposed.

In an embodiment, since physically connected to each other, the first metal stripping layer 211 and the second metal stripping layer 212 are separated from each other merely by a physical method, such as a stripping method.

As illustrated in FIG. 3C, the first surface 23a of the core layer 23 is exposed by removing the second metal stripping layer 212 in an etching way.

In an embodiment, a portion of each of the first conductive pads 22' is removed by etching at the same time such that the surface of the first conductive pad 22' is lower than the first surface 23a of the core layer 23. Accordingly, the core layer 23 can be used as a solder resist layer without an insulating protection layer to be further formed the first surface 23a of the core layer 23.

As illustrated in FIG. 3D, a cutting process is performed along each of the package units 2a, for instance, along a cutting line S illustrated in FIG. 3C, so as to obtain a plurality of package structures 3 of another type. In addition, a plurality of solder balls 29 are implanted on the first conductive pads 22'.

Known form the sequential processes of the method of fabricating the package structure 3a having the holder 2b, since the copper clad laminate 20 and the strengthened board 21 are removed after the packaging process is performed on the insulating protection layer 25, the overall thickness of the package structure 3 of another type can be effectively reduced by the thickness h of the circuit structure 26 which is smaller than 60 μm. Therefore, compared with the prior art, the present invention can allow the thickness of the circuit structure 26 to be less than 60 μm according to the requirements so as to satisfy miniaturization demand.

Further, the packaging substrate 2 has the copper laminate 20 and the strengthened member 21 such that the overall strength of the packaging substrate 2 can be enhanced. Therefore, compared with the prior art, the packaging substrate 2 of the present invention will not break while being packaged.

In addition, the packaging substrate 2 can have the advantages of short transmission path of electrical signals, increased density of layouts, and increased pin numbers due to the extremely thin thickness thereof.

The present invention further provides the package structure 3a having the holder 2b, comprising: the core layer 23 having the first surface 23a and the second surface 23b opposite to the first surface 23a, the first conductive pads 22 embedded in and exposed from the first surface 23a of the core layer 23, the holder 2b disposed on the first surface 23a of the core layer 23, the circuit layer 24 formed on the second surface 23b of the core layer 23, the insulating protection layer 25 formed on the second surface 23b of the core layer 23 and the circuit layer 24, the chip 27 disposed on the insulating protection layer 25, and the encapsulant 28 formed on the insulating protection layer 25.

The core layer 23 is made of a dielectric material.

The holder 2b includes the insulating layer 200, the copper layers 201 and 202 formed on opposite sides of the insulating layer 200, the dielectric layer 210 formed on one of the copper layers 202, the first metal stripping layer 211 formed on the dielectric layer 210, and the second metal stripping layer 212 formed on the first metal stripping layer 211.

The first conductive pad 22 is further connected to the second metal stripping layer 212, and the solder balls 29 can be implanted on the first conductive pads 22' after the holder 2b is removed.

The circuit layer 24 has the plurality of second conductive pads 241 formed on the second surface 23b of the core layer 23 and the plurality of conductive vias 240 formed in the core layer 23 so as to be electrically connected to the first conductive pads 22.

The insulating protection layer 25 is formed on the second surface 23b of the core layer 23 and the circuit layer 24 and has the plurality of openings 250 so as to allow the second conductive pads 241 to be exposed from the opening 250 such that the surface treatment layer 25a is formed on the second conductive pad 241 in the opening 250.

The chip 27 is electrically connected to the second conductive pads 241 via the conducting wires 270.

The encapsulant 28 covers the chip 27 and the conducting wires 270.

In conclusion, the present invention can not only allow the thickness of the core layer to be less than 130 μm but also enhance the strength of the packaging substrate so as to prevent production operability issue by combining the holder comprising the copper clad laminate and the strengthened member with the packaging substrate.

Further, the copper clad laminate and the strengthened member are removed after packaging. Therefore, compared with the prior art, the present invention can reduce the overall thickness of the package structure due to the thickness of the circuit structure being smaller than 130 μm such that the requirements of product miniaturization and reliability can be satisfied.

In addition, compared with the prior art, the present invention can perform electroplating by directly using the second metal stripping layer as the conductive path without additionally forming electroplating conductive wires on the core layer such that the overall process can be simplified.

The foregoing embodiments are exemplarily illustrated to disclose the principles and effects of the present invention and not restrictive of the scope of the present invention. One skilled in the art could modify the previous embodiments without violating the spirit and scope of the present invention. Hence, it should be understood to those in the art that the disclosure of the present invention should fall within the scope of the appended claims.

What is claimed is:

1. A method of fabricating a packaging substrate having a holder, comprising:

providing two stacked copper clad laminates, each of which has an insulating layer and copper layers disposed on opposite sides of the insulating layer;

forming a strengthened board for embedding the stacked copper clad laminates therein, wherein the strengthened board has a dielectric layer covering the two copper clad laminates, two first metal stripping layers formed on opposite surfaces of the dielectric layer, and two second metal stripping layers formed on the first metal stripping layers respectively;

forming a plurality of first conductive pads on the second metal stripping layers;

forming on each one of the second metal stripping layers and the first conductive pads a core layer having a first surface and a second surface opposite to the first surface, in a manner that the first conductive pads are embedded in the first surface of each one of the core layers;

forming a circuit layer on the second surface of each one of the core layers;

forming in each one of the core layers a plurality of conductive vias for electrically connecting the first conductive pads and the circuit layer, wherein each one of the circuit layers has a plurality of second conductive pads;

forming an insulating protection layer on the second surface of each one of the core layers and each one of the circuit layers;

forming in each one of the insulating protection layer a plurality of openings for exposing the second conductive pads; and cutting through the two stacked copper clad laminates along a predetermined line approximate to sides of the two copper clad laminates such that the two stacked copper clad laminates are allowed to be separated from each other from the two attached copper layers so as to be separated into two individual packaging substrates each having the holder.

2. The method of claim 1, wherein the first metal stripping layer is attached to the second metal stripping layer in a physical manner.

3. The method of claim 1, further comprising forming a surface treatment layer on the second conductive pads in the openings after forming the openings of the insulating protection layer.

* * * * *